United States Patent [19]

Kondou et al.

[11] Patent Number: 4,662,801
[45] Date of Patent: May 5, 1987

[54] CUTTING TOOL

[75] Inventors: Masakazu Kondou; Takashi Nishiguchi, both of Yokohama, Japan

[73] Assignee: Hitachi, Ltd., Tokyo, Japan

[21] Appl. No.: 805,727

[22] Filed: Dec. 6, 1985

[30] Foreign Application Priority Data

Dec. 7, 1984 [JP] Japan .................. 59-257550

[51] Int. Cl.⁴ ............................. B23B 27/18
[52] U.S. Cl. .................. 407/119; 76/101 R; 76/101 A; 156/DIG. 86; 156/DIG. 99; 407/118; 408/145; 423/284; 423/290
[58] Field of Search ............... 407/118, 119; 408/145; 76/101 R, 101 A, DIG. 12; 156/DIG. 86, DIG. 99; 423/284, 290

[56] References Cited

U.S. PATENT DOCUMENTS

| | | | |
|---|---|---|---|
| 2,564,136 | 8/1951 | Verheyen | 407/119 |
| 2,947,617 | 8/1960 | Wentorf | 156/DIG. 86 |
| 3,025,847 | 3/1962 | Miller | 407/119 |
| 3,192,015 | 6/1965 | Wentorf | 156/DIG. 86 |
| 3,834,265 | 9/1974 | Tafapolsky et al. | 76/DIG. 12 |
| 3,850,053 | 11/1974 | Bovenkerk | 76/101 R |
| 4,560,853 | 12/1985 | Ziegel | 76/DIG. 12 |

FOREIGN PATENT DOCUMENTS

| | | | |
|---|---|---|---|
| 2323808 | 11/1974 | Fed. Rep. of Germany | 407/119 |
| 16306 | 1/1985 | Japan | 408/145 |

OTHER PUBLICATIONS

IBM Technical Disclosure Bulletin, vol. 16, No. 9, Feb. 1974, "Diamond Tool", by Biedermann and Bohg.

*Primary Examiner*—Nicholas P. Godici
*Assistant Examiner*—Jerry Kearns
*Attorney, Agent, or Firm*—Antonelli, Terry & Wands

[57] ABSTRACT

This invention relates to a tool for use in carrying out a cutting process, and more particularly to a cutting tool formed so that it can be sued to cut an iron material of a high hardness and thereby obtain a mirror-polished surface thereon, the cutting tool being characterized in that it is formed by attaching a monocrystal of boron nitride to the tip thereof so that predetermined surface and orientation of the crystal are set suitably. To be concrete, the present invention is directed to a cutting tool in which monocrystalline boron nitride is used for a tip which forms a blade of the cutting tool, (111) surface of this boron nitride being used as a relief surface of the blade, <211> direction being used as a cutting direction; or a cutting tool of the same material, in which (100) surface of the boron nitride is used as a relief surface of the blade, <110> direction being used as a cutting direction.

4 Claims, 11 Drawing Figures

CUTTING TOOL

BACKGROUND OF THE INVENTION:

This invention relates to a tool for use in carrying out a cutting process, and more particularly to a cutting tool formed so that it can be used to cut an iron material of a high hardness and thereby obtain a mirror-polished surface thereon.

A cutting tool having an edge consisting of monocrystalline diamond is known well, which is used as a tool for precision cutting or mirror polishing a material of a non-ferrous metal, such as aluminum and copper.

When an iron material, for example, hardened carbon steel and stainless steel is cut with such a cutting tool using diamond, the diamond reacts with the iron due to the cutting heat to produce carbide, so that the diamond wears rapidly. This hampers a normal cutting operation.

Therefore, a cutting tool in which an edge is formed on a crystal which is obtained by sintering crystals of boron nitride is used to cut an iron material. This cutting tool is formed by, for example, attaching a tip formed of a polycrystalline sinter to a shank via a base. A chamfer and a relief surface are formed on an edge of the tip. Even if the relief surface, which has influence upon the roughness of a cut surface, of such a cutting tool is formed by cutting the mentioned material and polishing the same so that the roughness of surface becomes not more than 0.05 $\mu$m Rmax, a mirror surface having a roughness of surface exceeding 0.1 $\mu$m Rmax cannot be obtained.

The cause of this inconvenience resides in that the sharpness of a relief surface, which constitutes a blade, and an edge, which is formed of a face, in a tip consisting of polycrystalline sinter cannot be secured due to the micro-chipping of a binder with which the crystal grains are bound.

According to the specification of Japanese Utility Model Application No. 62592/1982 (Japanese Utility Model Laid-Open No. 164603/1983), a tip for a precision processing tool is proposed, in which grains of monocrystal of cubic boron nitride are used at an edge of the blade thereof. If different surfaces of a monocrystal and different orientations thereof are used as the relief surface of a blade and cutting direction, respectively, the abrasion characteristics of the tool differ greatly. No consideration is given to this matter in the tool proposed by the above utility model application.

SUMMARY OF THE INVENTION

An object of the present invention is to provide a cutting tool which is capable of carrying out the higher-degree mirror polishing of an iron material.

The achieve the above object, the present invention is formed by attaching a monocrystal of boron nitride to the tip of a cutting tool so that predetermined surface and orientation of the crystal are set in a suitable manner.

The present invention will now be described more in detail. In a first invention in the present application, monocrystalline boron nitride is used for a tip which forms a blade of the cutting tool, and (111) surface of this boron nitride as a relief surface of the blade, the <211> direction being used as a cutting direction. In a second invention, monocrystalline boron nitride is used for a tip which forms a blade, and (100) surface of this boron nitride as a relief surface of the blade, the <110> direction being used as a cutting direction.

BRIEF DESCRIPTION OF THE DRAWINGS

FIGS. 2–4 show an embodiment of a straight shape cutting tool according to the present invention in the order of its manufacturing steps, wherein:

FIG. 2 is a perspective view of a monocrystal of boron nitride buried in a shank;

FIG. 3 is an enlarged section of a principal portion of what is shown in FIG. 2; and FIG. 4 is an enlarged view of an edge of a blade.

DESCRIPTION OF THE PREFERRED EMBODIMENTS

Cutting a material with a cutting tool in which an edge of a tip is formed of a monocrystal of boron nitride, to obtain a mirror polished surface thereon was discussed to propose a cutting tool disclosed in Japanese Patent Application No. 209074/1983 (Japanese Patent Laid-Open No. 104602/1985), in which the (110) surface or (111) surface of a monocrystal of boron nitride is positioned so that it serves as the relief surface of the blade of the tool. However, it was discovered by experiments, which were conducted after the above application had been filed, that the abrasion characteristics of surfaces (110), (111) are different, and that, unless the orientation of crystal in the cutting direction in the (111) and (110) surfaces was suitably selected, the abrasion of the edge markedly increased. The present inventors grasped the correlation between the abrasion direction and abrasion characteristics of each surface of the monocrystal of boron nitride, and discussed such correlation from various aspects to discover that, if (111) surface and <211> direction, on and in which the abrasion rate is the lowest, are used as a relief surface of an edge and the cutting direction, respectively, good effects can be obtained. This discovery led the achievement of the present invention.

According to the above-described construction, this cutting tool using boron nitride can be suitably used for cutting an iron material as well. Since the relief surface of the edge and the cutting direction are set selectively as mentioned above, the cutting tool has a low abrasion rate and a long lifetime.

An embodiment of the present invention will now be described with reference to the accompanying drawings.

Figure 1A:
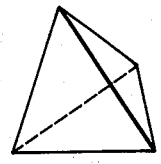
Figs. 1a–1f are enlarged views showing the crystal habit of monocrystals of cubic boron nitride.
Figure 1B:
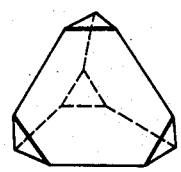
Figure 1C:
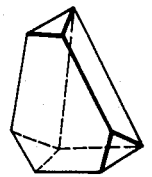
Figure 1D:
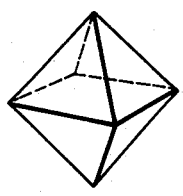
Figure 1E:
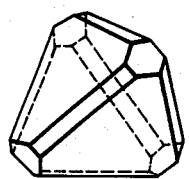
Figure 1F:
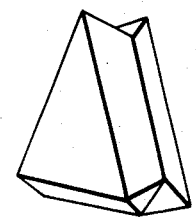
Figure 2:
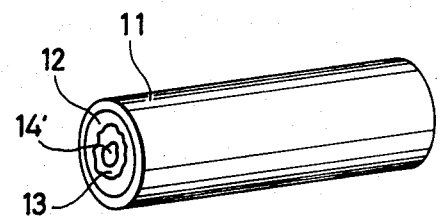
Figure 3:
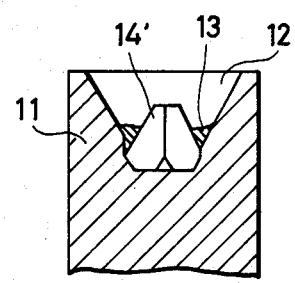
Figure 4:
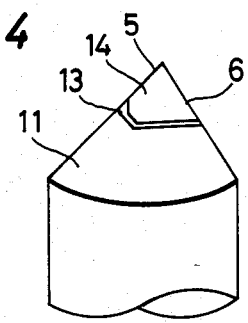

FIGS. 1a–1f show the typical crystal habit of cubic crystals of boron nitride, which have the highest hardness among the monocrystals of boron nitride which can be used in the present invention. In these monocrystals, all of the triangular and hexagonal surfaces are (111) surfaces. FIGS. 2–4 illustrate the steps of manufacturing the straight shape cutting tool in this embodiment, wherein FIG. 4 shows the edge of the blade of the cutting tool in this embodiment.

As shown in FIG. 4, the blade, a cutting part, of this cutting tool is provided with a tip 14 formed at its angle, and a shank 11 holding this tip 14. The tip 14 is formed of monocrystalline boron nitride. In this cutting tool, (111) surface of a crystal of boron nitride is used as a relief surface 5 of the blade. The <211> direction is determined as the cutting direction.

The surface (111) and direction <211> are determined as the relief surface and cutting direction, respectively, for the following reasons.

Figure 5:
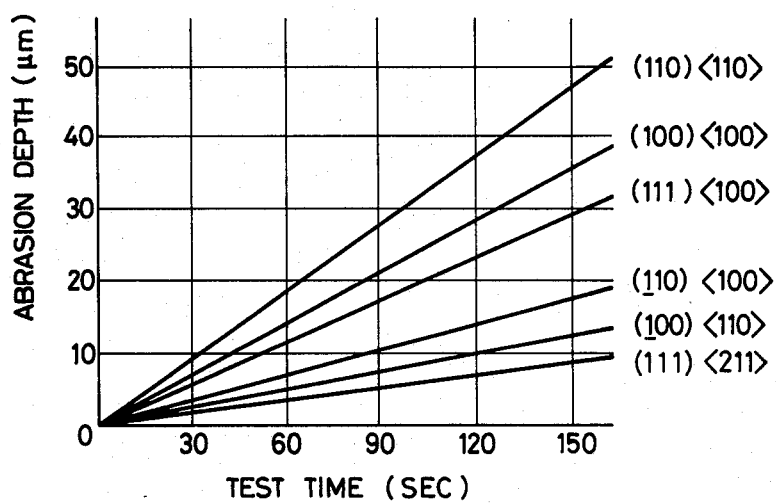
FIG. 5 is a graph showing the relation between the test time and abrasion depth of each surface of a monocrystalline boron nitride.

FIG. 5 is used for reference, which shows the correlation between the test time and the abrasion depths at the respective surfaces, i.e. the abrasion characteristics determined of the typical (100), (110), (111) surfaces. As may be understood from the figure, the abrasion rate is the lowest when the (111) surface is cut in <211> direction. Therefore, if (111) surface (in FIG. 5, (111) surface is shown as a representative) and <211> direction are determined as the relief surface 5 of the blade of monocrystalline boron nitride and the cutting direction, respectively, a cutting tool having a low abrasion rate and improved lifetime can be obtained. It can be ascertained that the polishing rate in <211> direction on (111) surface is not more than ⅓ of that in <100> direction on the same surface, and that the polishing rate in <211> direction on (111) surface is not more than 1/5 of that in <110> direction on (110) surface.

An example of the process for manufacturing the cutting tool in this embodiment will now be described with reference to FIGS. 2-4. FIG. 2 shows a single crystal 14' of boron nitride buried in a shank 11. As shown in FIG. 3, the shank 11 is provided at one end portion thereof with a conical bore 12, to the bottom portion of which a brazing filler metal 13 is supplied, a single crystal 14' of boron nitride being disposed on the brazing filler metal 13. The single crystal 14' is then pressed in the axial direction of the shank 11 as the shank 11 is heated to melt the brazing filler metal 13, to thereby pressure-fit a part of the single crystal 14' into the shank 11, i.e., what is shown in FIG. 2 is turned into what is shown in FIG. 3. The shank 11 is then cooled to harden the brazing filler metal 13, and the single crystal 14' as well as the shank 11 are cut and polished to form a relief surface 5 and a face 6, which are shown in FIG. 4, a cutting tool being thereby obtained.

The relief surface 5 can be formed as a front relief surface. Forming a front relief surface generally increases the accuracy of the cutting tool. A side relief surface and some other relief surface can be suitably formed. When a material is cut spirally to obtain an article like a screw, a side relief surface also produces excellent effect.

Figure 6:
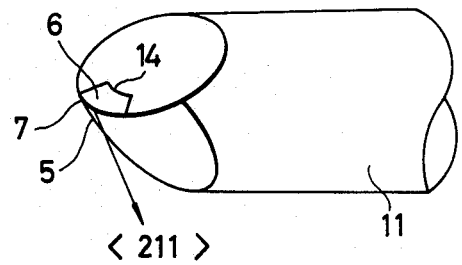
FIG. 6 is an enlarged view of the edge of a round shape cutting tool in another embodiment of the present invention.

FIG. 6 shows an example of a round shape cutting tool using monocrystalline cubic boron nitride. This bit is set so that <211> direction on (111) surface on the relief surface 5 is in conformity with the cutting direction. Referring to FIG. 6, reference numeral 14 denotes a tip as in the previously-described example, and an angle 7 of the tip 14 constitutes an edge, the tip 14 being supported on a shank 11. Reference numeral 6 denotes a face. Owing to the surface direction and cutting direction set in this manner, the abrasion rate of the bit of monocrystalline cubic boron nitride during a cutting operation corresponding to the above-mentioned polishing rate can be reduced, and the lifetime of the bit can be prolonged.

According to the present invention, the boron nitride in use consists of a single crystal thereof but it is not limited to a single crystal in a strict sense. It may consist of a twin crystal composed of a unitary combination of two or three crystals and apt to be formed during the synthesis of a crystal, if the typical crystal which constitutes the main body of the blade is in the above-mentioned condition. A cutting tool using such a twin crystal ought to have the same effect as mentioned above. The "single crystal" referred to in the specification of the present invention includes such a crystal.

The value of the surface direction of the face of monocrystalline boron nitride of a blade of a cutting tool and the value of the cutting direction in the surface are not a so limited strictly and exactly. If the values of the surface direction and cutting direction in the surface are in the vicinity of the directions designated above, the effect of the present invention can be obtained. Namely, the surface direction and cutting direction may be substantially in accordance with (111) surface and <211> direction, respectively, which are broad-gauged definitions and can be used liberally if the predetermined effect is not lost.

It is considered that a monocrystalline boron nitride the abrasion depth of which is not more than 15 $\mu$m with respect to the test time of 150 sec. in accordance with FIG. 5 can be used sufficiently in practice. Accordingly, a combination of the surface direction (100) and cutting direction <110> in addition to the combination of the surface direction (111) and cutting direction <211> also enables a cutting tool having substantially the same effect as mentioned above to be obtained.

In the cutting tool according to the present invention described above, the tip is formed of boron nitride. Therefore, the cutting tool can be suitably used for cutting an iron material as well. Since the (111) surface of monocrystalline boron nitride is used as the face of the blade with <211> direction used as the cutting direction, the abrasion resistance of the cutting tool can be improved, and the lifetime thereof can be increased. The tool in the above-described embodiment was used for cutting, for example, an iron material to prove that the bit thereof had a lifetime not less than three times as long as that of the bit of a conventional cutting tool of this kind.

What is claimed is:

1. A cutting tool having a tip on which a cutting edge extending along an angle thereof is formed, and a tip-holding shank, characterized in that said tip is formed of monocrystalline boron nitride, a relief surface of said cutting edge consisting of (111) surface of said monocrystalline boron nitride, a cutting direction being set to <211> direction.

2. A cutting tool according to claim 1, wherein said relief surface is a front relief surface.

3. A cutting tool having a tip on which a cutting edge extending along an angle thereof is formed, and a tip-holding shank, characterized in that said tip is formed of monocrystalline boron nitride, a relief surface of said cutting edge consisting of (100) surface of said monocrystalline boron nitride, a cutting direction being set to <110> direction.

4. A cutting tool according to claim 3, wherein said relief surface is a front relief surface.

* * * * *